(12) United States Patent
Schultz

(10) Patent No.: US 10,608,076 B2
(45) Date of Patent: Mar. 31, 2020

(54) OSCILLATING CAPACITOR ARCHITECTURE IN POLYSILICON FOR IMPROVED CAPACITANCE

(71) Applicant: Advanced Micro Devices, Inc., Sunnyvale, CA (US)

(72) Inventor: Richard T. Schultz, Fort Collins, CO (US)

(73) Assignee: Advanced Micro Devices, Inc., Santa Clara, CA (US)

(*) Notice: Subject to any disclaimer, the term of this patent is extended or adjusted under 35 U.S.C. 154(b) by 0 days.

(21) Appl. No.: 15/466,643

(22) Filed: Mar. 22, 2017

(65) Prior Publication Data
US 2018/0277624 A1    Sep. 27, 2018

(51) Int. Cl.
*H01L 49/02* (2006.01)
*H01L 23/522* (2006.01)
*H01L 21/3213* (2006.01)

(52) U.S. Cl.
CPC .......... *H01L 28/92* (2013.01); *H01L 23/5223* (2013.01); *H01L 28/75* (2013.01);
(Continued)

(58) Field of Classification Search
CPC ......... H01L 28/75; H01L 28/82; H01L 28/92; H01L 28/40; H01L 27/0805; H01L 23/5223
See application file for complete search history.

(56) References Cited

U.S. PATENT DOCUMENTS 6,156,600 A * 12/2000 Chao .................. H01L 28/40
                                                      438/238
6,191,479 B1    2/2001 Herrell et al.
(Continued)

FOREIGN PATENT DOCUMENTS

JP        2000138344 A    5/2000

OTHER PUBLICATIONS

Schultz, Richard T., U.S. Appl. No. 15/474,043, entitled "Sinusoidal Shaped Capacitor Architecture in Oxide", filed Mar. 30, 2017, 26 pages.
(Continued)

*Primary Examiner* — David C Spalla
(74) *Attorney, Agent, or Firm* — Rory D. Rankin; Kowert, Hood, Munyon, Rankin & Goetzel, P.C.

(57) ABSTRACT

A system and method for fabricating metal insulator metal capacitors while managing semiconductor processing yield and increasing capacitance per area are described. A semiconductor device fabrication process places a polysilicon layer on top of an oxide layer which is on top of a metal layer. The process etches trenches into areas of the polysilicon layer where the repeated trenches determine a frequency of an oscillating wave structure to be formed later. The top and bottom corners of the trenches are rounded. The process deposits a bottom metal, a dielectric, and a top metal on the polysilicon layer both on areas with the trenches and on areas without the trenches. A series of a barrier metal and a second polysilicon layer is deposited on the oscillating structure. The process completes the MIM capacitor with metal nodes contacting each of the top metal and the bottom metal of the oscillating structure.

20 Claims, 9 Drawing Sheets

(52) U.S. Cl.
CPC .............. *H01L 28/84* (2013.01); *H01L 28/90* (2013.01); *H01L 21/32134* (2013.01); *H01L 21/32136* (2013.01)

(56) References Cited

U.S. PATENT DOCUMENTS

| | | | |
|---|---|---|---|
| 6,977,198 B2 | 12/2005 | Gau | |
| 7,456,072 B2 | 11/2008 | Olewine et al. | |
| 8,178,404 B2 | 5/2012 | Olewine et al. | |
| 9,461,131 B1* | 10/2016 | Xiong | ............... H01L 29/42364 |
| 9,570,456 B1* | 2/2017 | Jen | ........................ H01L 28/60 |
| 2001/0041402 A1* | 11/2001 | Yamamoto | .............. H01L 28/75 |
| | | | 438/238 |
| 2004/0152259 A1 | 8/2004 | Seo | |
| 2005/0035390 A1* | 2/2005 | Beroz | .................... H01G 9/032 |
| | | | 257/306 |
| 2006/0021570 A1 | 2/2006 | Hasebe et al. | |
| 2007/0267705 A1 | 11/2007 | Won et al. | |
| 2011/0272702 A1* | 11/2011 | Kwon | ............... H01L 27/10867 |
| | | | 257/71 |
| 2012/0012982 A1 | 1/2012 | Korec et al. | |
| 2013/0161792 A1* | 6/2013 | Tran | ........................ H01L 29/92 |
| | | | 257/534 |
| 2013/0334661 A1* | 12/2013 | Nagakura | ............... H01L 28/40 |
| | | | 257/532 |
| 2014/0104745 A1 | 4/2014 | Zheng | |
| 2014/0374879 A1* | 12/2014 | Chen | ................. H01L 27/10861 |
| | | | 257/532 |
| 2015/0214150 A1* | 7/2015 | Chang | ................. H01L 23/5256 |
| | | | 257/529 |
| 2015/0295020 A1* | 10/2015 | Tseng | .................... H01L 23/481 |
| | | | 257/532 |
| 2016/0035818 A1 | 2/2016 | Hoentschel et al. | |
| 2016/0043068 A1 | 2/2016 | Ramachandran et al. | |
| 2016/0126239 A1* | 5/2016 | Singh | .................. H01L 27/0682 |
| | | | 257/532 |
| 2016/0218172 A1 | 7/2016 | Hsieh et al. | |

OTHER PUBLICATIONS

International Search Report and Written Opinion in International Application No. PCT/US2018/025324, dated Jun. 22, 2018, 11 pages.

International Search Report and Written Opinion in International Application No. PCT/US2018/023814, dated Jun. 22, 2018, 12 pages.

* cited by examiner

OSCILLATING CAPACITOR ARCHITECTURE IN POLYSILICON FOR IMPROVED CAPACITANCE

BACKGROUND

Description of the Relevant Art

As both semiconductor manufacturing processes advance and on-die geometric dimensions reduce, semiconductor chips provide more functionality and performance while consuming less space. While many advances have been made, design issues still arise with modern techniques in processing and integrated circuit design that may limit potential benefits. For example, as the number and size of passive components used in a design increase, the area consumed by these components also increases. Impedance matching circuits, harmonic filters, decoupling capacitors, bypass capacitors and so on are examples of these components.

Many manufacturing processes use metal insulator metal (MIM) capacitors to provide capacitance in both on-die integrated circuits and off-chip integrated passive device (IPD) packages. A MIM capacitor is formed with two parallel metal plates separated by a dielectric layer. Generally speaking, each of the two metal plates and the dielectric layer is parallel to a semiconductor substrate surface. Such MIM capacitors are used in a variety of integrated circuits, including oscillators and phase-shift networks in radio frequency (RF) integrated circuits, as decoupling capacitors to reduce noise in both mixed signal integrated circuits and microprocessors as well as bypass capacitors near active devices in microprocessors to limit the parasitic inductance, and so on. MIM capacitors may also be used as memory cells in a dynamic RAM.

Fabricating MIM capacitors is a challenging process. The material selection for the dielectric layer is limited as many of the materials used for the dielectric layer may diffuse with the metal layers used for the parallel metal plates. This limited selection can also reduce the capacitance per area that might otherwise be achieved. Further, the dielectric layer is typically larger than the gate oxide layer used for active devices such as transistors. Therefore, the MIM capacitors are relatively large, and at times, are larger than the transistors used on the die. When the MIM capacitor sizes are increased to provide the necessary capacitance per area (density), less space is available for other components on the device. In addition, when etching to create space for vias used for connecting the parallel metal plates of a MIM capacitor, other vias must connect to the lower metal layer under the MIM capacitor. Therefore, the chance for etch stop problems increases.

In view of the above, efficient methods and systems for fabricating metal insulator metal capacitors while managing semiconductor processing yield and increasing capacitance per area are desired.

Figure 1:
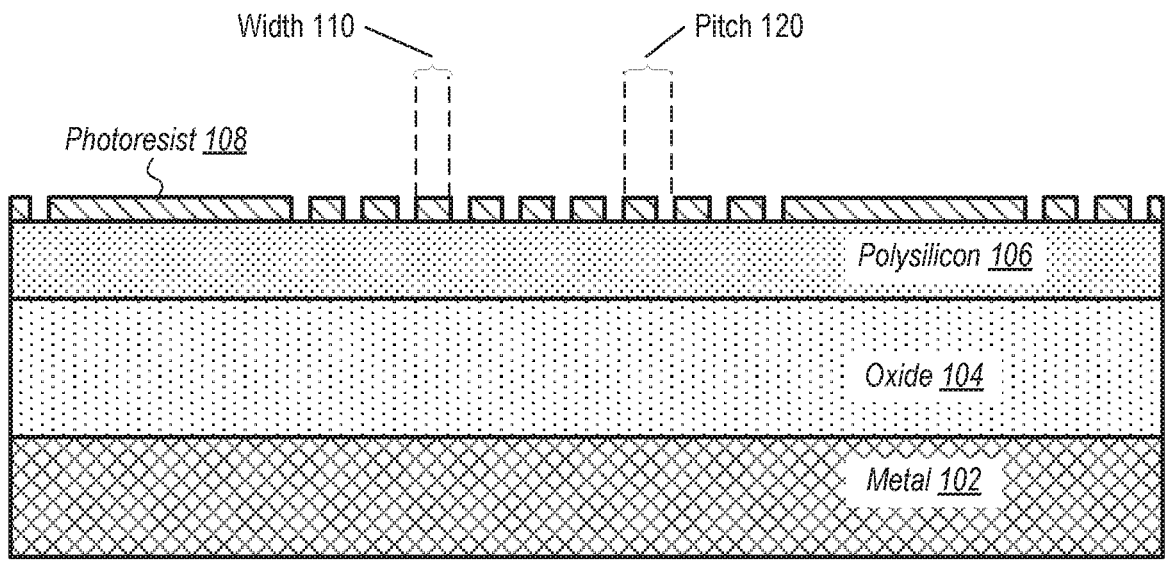
FIG. 1 is a generalized diagram of a cross-sectional view of a portion of a semiconductor passive component being fabricated.

While the invention is susceptible to various modifications and alternative forms, specific embodiments are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the scope of the present invention as defined by the appended claims.

DETAILED DESCRIPTION

In the following description, numerous specific details are set forth to provide a thorough understanding of the present invention. However, one having ordinary skill in the art should recognize that the invention might be practiced without these specific details. In some instances, well-known circuits, structures, and techniques have not been shown in detail to avoid obscuring the present invention. Further, it will be appreciated that for simplicity and clarity of illustration, elements shown in the figures have not necessarily been drawn to scale. For example, the dimensions of some of the elements are exaggerated relative to other elements.

Systems and methods for fabricating metal insulator metal capacitors while managing semiconductor processing yield and increasing capacitance per area are contemplated. In various embodiments, a semiconductor device fabrication process places an oxide layer on top of a metal layer followed by placing a polysilicon layer on top of the oxide layer. A photoresist layer is formed on top of the polysilicon layer and etched with repeating spacing which determines a frequency of an oscillating wave structure to be formed later and used as a metal-insulator-metal (MIM) capacitor. In various embodiments, the oscillating wave structure is approximately sinusoidal in nature. In other embodiments, the oscillating wave structure is not sinusoidal. Rather, the oscillating wave structure may approximate a square wave, saw tooth wave, or other oscillating wave structure. In various embodiments, the etching forms multiple trenches that are approximately equally spaced. One of a variety of lithography techniques is used to reduce the pitch (increase the frequency) of the trenches.

The process etches trenches into areas of the polysilicon layer unprotected by the photoresist layer and then strips the photoresist layer. The top and bottom corners of the trenches are rounded to create a basis for the oscillating wave structure. In some embodiments, the process performs one or more cycles of relatively high temperature oxidation of the polysilicon layer and oxidation removal to round the corners. The process deposits a series of layers including the bottom metal, dielectric and top metal of the MIM capacitor on the polysilicon layer. The deposition of the series of layers is performed both on areas with the trenches and on areas without the trenches.

A second polysilicon layer is deposited on the top metal layer of the oscillating wave structure followed by a barrier metal layer being deposited on the second polysilicon layer. Locations for vias are etched through the multiple layers of the barrier metal, second polysilicon layer, the top metal of the oscillating pattern, and the dielectric layer of the oscillating pattern. An insulating oxide layer is deposited over the barrier metal and trenches are etched at the locations for vias. Trenches are etched into the insulating oxide for vias to be placed. One via makes contact with the bottom metal of the oscillating pattern and a second via makes contact with the top metal of the oscillating pattern through the barrier metal and the polysilicon layer above the top metal.

In the upcoming description of FIGS. 1-15, the fabrication steps for a metal-insulator-metal (MIM) capacitor while managing semiconductor processing yield and increasing capacitance per area are described. Turning to FIG. 1, a generalized block diagram of a cross-sectional view of a portion of a semiconductor passive component being fabricated is shown. Unlike active components, such as field effect transistors, passive components are not turned on prior to controlling current flow by means of another signal such as a voltage signal. There is no threshold voltage for passive components.

A metal insulator metal (MIM) capacitor is being fabricated. Here, a metal layer 102 is deposited on an inter-level dielectric (ILD), which is not shown. In various embodiments, the ILD is used to insulate metal layers which are used for interconnects. In some embodiments, the ILD is silicon dioxide. In other embodiments, the ILD is one of a variety of low-k dielectrics containing carbon or fluorine. The low-k dielectrics provide a lower capacitance between the metal layers, and thus, reduces performance loss, power consumption and cross talk between interconnect routes. A chemical mechanical planarization (CMP) step is used to remove unwanted ILD and to polish the remaining ILD. The CMP step achieves a near-perfect flat and smooth surface upon which further layers are built. For example, deposition of the metal layer 102 follows.

In one embodiment, the metal layer 102 is copper. In another embodiment, the metal layer 102 is aluminum or a copper and aluminum mix. In some embodiments, the metal layer 102 is formed by a dual damascene process. In other embodiments the metal layer 102 formed by a single damascene process. These and other techniques are contemplated. In embodiments with copper used as the metal layer 102, a liner using a tantalum (Ta) based barrier material is deposited on the dielectric before the metal layer 102 is formed. The liner prevents the copper from diffusing into the dielectric and acts as an adhesion layer for the copper. Next a thin copper seed layer is deposited by physical vapor diffusion (PVD) followed by electroplating of copper. Next the excess copper metal layer 102 is chemical mechanical polished and a capping layer typically silicon nitride (SiN) is deposited. Afterward, an oxide layer 104 of a controlled thickness is formed. In various embodiments, the oxide layer 104 is silicon dioxide.

In various embodiments, a plasma-enhanced chemical vapor deposition (PECVD) process is used to deposit a thin film of silicon dioxide from a gas state (vapor) to a solid state on the metal layer 102. The PECVD process introduces reactant gases between a grounded electrode and a parallel radio frequency (RF) energized electrode. The capacitive coupling between the electrodes excites the reactant gases into a plasma, which induces a chemical reaction and results in the reaction product being deposited on the metal layer 102.

In some embodiments, the oxide layer 104 is deposited using a combination of gasses such as dichlorosilane or silane with oxygen precursors, such as oxygen and nitrous oxide, typically at pressures from a few millitorr to a few torr. The thickness of the oxide layer 104 is relatively thick. For example, the thickness of the oxide layer 104 is at least an order of magnitude greater than a thickness of a thin gate silicon dioxide layer formed for active devices such as transistors. In some embodiments, no further polishing of the oxide layer 104 is performed. In other embodiments, a chemical mechanical planarization (CMP) step is used to remove unwanted silicon dioxide and to polish the remaining oxide layer 104.

After the oxide layer 104 is deposited, a polysilicon layer 106 is deposited on the oxide layer 104. In some embodiments, low pressure chemical vapor deposition (LPCVD) is used to deposit the polysilicon layer 106. In other embodiments, the polysilicon layer 106 is deposited by the thermal decomposition or pyrolysis of silane at relatively high temperatures. Following, a photoresist layer 108 is placed on the polysilicon layer 106 with a pattern removed. The removed pattern is for initially defining the oscillating shape of the metal insulator metal (MIM) capacitor being fabricated.

In some embodiments, the extreme ultraviolet lithography (EUV) technique is used to provide the resolution of each of the width 110 and the pitch 120. The EUV technique uses an extreme ultraviolet wavelength to reach resolution below 40 nanometers. The extreme ultraviolet wavelength is approximately 13.5 nanometers. Relatively high temperature and high density plasma is used to provide the EUV beam. In other embodiments, the directed self-assembly (DSA) lithography technique used to provide the resolution of each of the width 110 and the pitch 120. The DSA technique takes advantage of the self-assembling properties of materials to reach nanoscale dimensions.

In yet other embodiments, the resolution of each of the width 110 and the pitch 120 in the photoresist layer 108 is set by the immersion lithography technique. Immersion lithography uses a liquid medium, such as purified water, between the lens of the imaging equipment and the wafer surface. Previously, the gap space was simply air. The resolution achieved by this technique is the resolution of the imaging equipment increased by the refractive index of the liquid medium. In some examples, the increased resolution falls above 80 nanometers.

In other embodiments, the double patterning technique is used to provide the resolution of each of the width 110 and the pitch 120. The double patterning technique uses immersion lithography systems to define features with resolution between 40 and 80 nanometers. Either of the self-aligned doubled patterning (SADP) technique or the litho-etch-litho-etch (LELE) technique is used. The double patterning technique counteracts the effects of diffraction in optical lithography, which occurs when the minimum dimensions of features on a wafer are less than the 193 nanometer wavelength of the illuminating light source. Other examples of techniques used to counteract the effects of diffraction in optical lithography are phase-shift masks, optical-proximity correction (OPC) techniques, optical equipment improvements and computational lithography.

When selecting between immersion lithography, double patterning, EUV and DSA techniques, and other techniques, cost is considered as the cost increases from immersion lithography to EUV. However, over time, the costs of these techniques adjust as well as additional and newer techniques are developed for providing relatively high resolution for the width 110 and the pitch 120. Accordingly, one of a variety of lithography techniques is used to provide relatively high resolution for the width 110 and the pitch 120. As described later, the relatively high resolution for the width 110 and the pitch 120 provides a higher capacitance per area density for a metal-insulator-metal (MIM) capacitor being fabricated.

Figure 2:
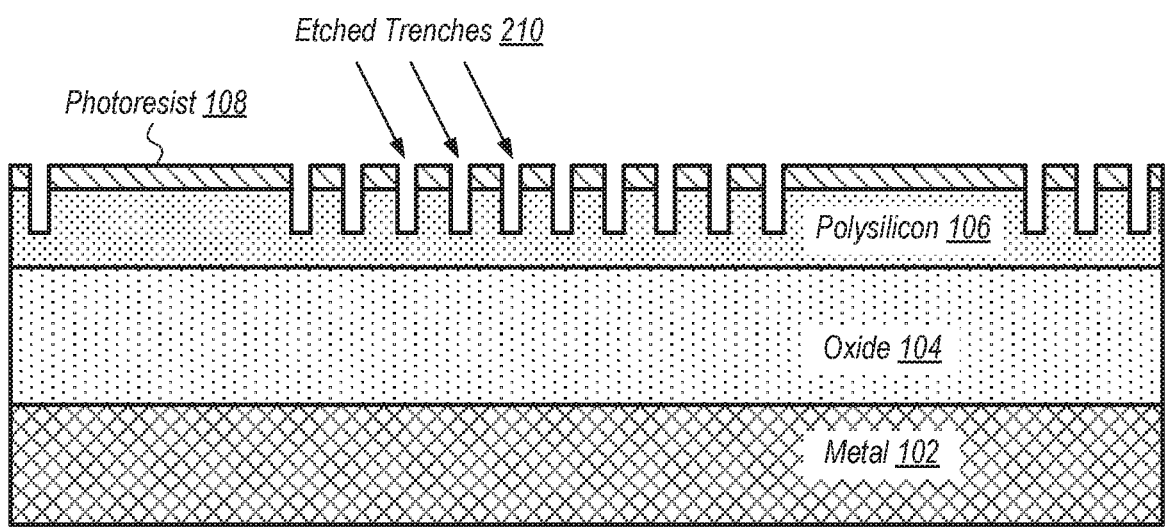
FIG. 2 is a generalized diagram of another cross-sectional view of a portion of a semiconductor passive component being fabricated.

Referring to FIG. 2, a generalized block diagram of another cross-sectional view of a portion of a semiconductor passive component being fabricated is shown. Materials and layers described earlier are numbered identically. As shown, regions of the polysilicon layer 106 are etched. The etched trenches 210 are placed in regions where the polysilicon layer 106 is unprotected by the photoresist layer 108. In some embodiments, an anisotropic wet etch is performed to create either trapezoidal or vertical walls for the trenches 210. Potassium hydroxide (KOH) or tetramethyl ammonium hydroxide (TMAH) is used for this type of etch. The etch time and etch rate are monitored to determine the etch depth. The depth of the trenches in addition to the width and pitch of the trenches determines the capacitance per area density for the MIM capacitor being fabricated.

In yet other embodiments, a dry etch process is used to provide the etched trenches 210. A reactive-ion etching (RIE) process generates a plasma by an electromagnetic field under a relatively low pressure to remove material. The RIE process is a relatively high anisotropic etch process for creating and trenches. Portions of the polysilicon layer 106 not protected by the photoresist layer 108 are immersed in plasma, which is a reactive gas. The unprotected portions of the polysilicon layer 108 are removed by chemical reactions and/or ion bombardment. The reaction products are carried away in the gas stream.

Plasma etching processes can operate in one of multiple modes by adjusting the parameters of the etching process. Some plasma etching processes operate with a pressure between 0.1 torr and 5 torr. In various embodiments, the source gas for the plasma contains chlorine or fluorine. For example, mixtures containing chlorine and bromine are known to inhibit lateral etching and thus provide vertical walls for the trenches 210. Examples of etching mixtures are tetrafluoromethane (CF4), trifluoromethane (CHF3) and octafluorocyclobutane (C4F8).

As shown, the etched trenches 210 have sharp corners. However, in other embodiments, the parameters used for the plasma etching process are adjusted to provide rounded corners for the etched trenches 210. The rounded corners aid in providing conformity in later processing steps where metal and dielectric are deposited on the surfaces of the trenches for building a MIM capacitor. These deposition steps are described shortly. In addition, sharp corners cause a concentration of the electric field for the later-fabricated MIM capacitor, so the rounded corners aid in reducing this effect.

Figure 3:
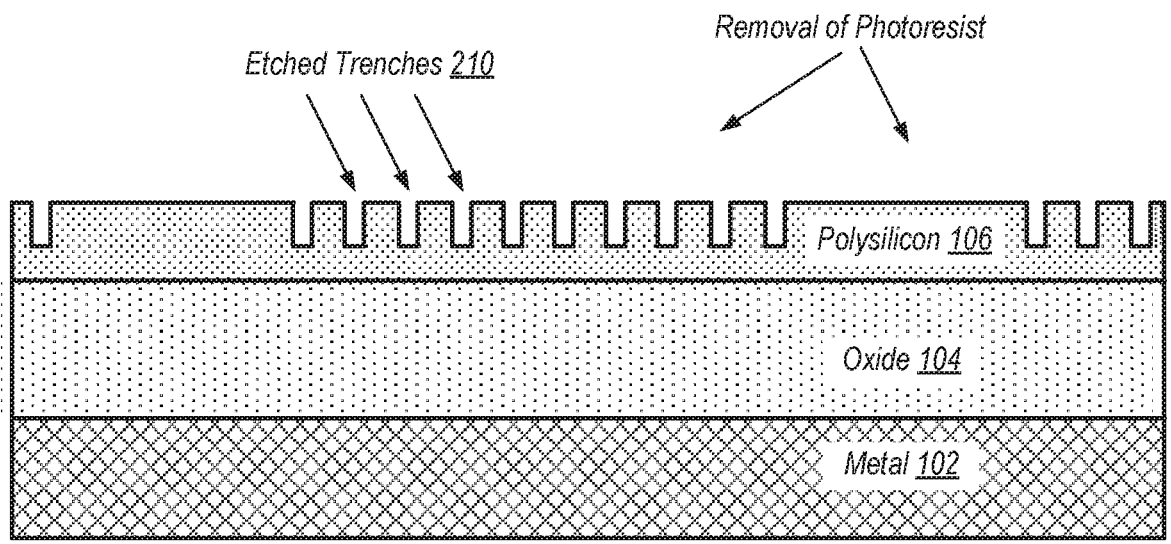
FIG. 3 is a generalized diagram of another cross-sectional view of a portion of a semiconductor passive component being fabricated.
Figure 4:
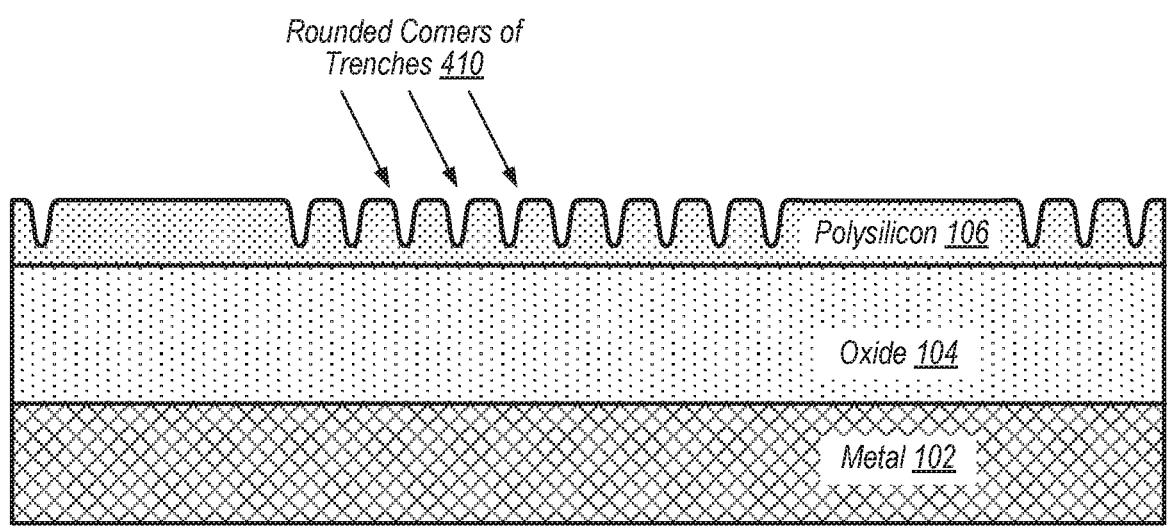
FIG. 4 is a generalized diagram of another cross-sectional view of a portion of a semiconductor passive component being fabricated.

Turning now to FIG. 3, a generalized block diagram of another cross-sectional view of a portion of a semiconductor passive component being fabricated is shown. Here, the photoresist layer 108 is removed. A source gas for plasma containing oxygen is used to oxidize ("ash") photoresist, which facilitates the removal of the photoresist. Referring to FIG. 4, a generalized block diagram of another cross-sectional view of a portion of a semiconductor passive component being fabricated is shown. As shown, the trenches have both rounded top corners and rounded bottom corners. As described earlier, the rounded corners of the trenches 410 aid in providing conformity in later processing steps where metal and dielectric are deposited on the surfaces of the trenches for building a MIM capacitor. In addition, sharp corners cause a concentration of the electric field for the later-fabricated MIM capacitor, so the rounded corners aid in reducing this effect.

In some embodiments, as described earlier, the rounded corners of the trenches are already created or partially created by adjusting the parameters used for the earlier plasma etching process on the polysilicon layer 106. In other embodiments, relatively high temperature oxidation is also used. For example, a relatively high temperature oxidation step followed by removal of the oxide with dry etching is repeated a number of times in order to round the corners. In some embodiments, atomic-layer etch (ALE) technology is used to round the top and bottom rounded corners of the trenches 410. ALE technology is also referred to as digital etch and single layer etch. A variety of other techniques for rounding the top corners and the bottom corners of the trenches are possible and contemplated.

The rounded trench corners (both top corners and bottom corners) provide a sinusoidal-like waveform in the polysilicon layer 106. In various embodiments, the waveform is not a symmetrical shape. In some embodiments, the top "half" of the wave has a different width than the bottom "half" of the wave. Similarly, in one embodiment, the height of the top "half" of the wave is different than the height (depth) of the bottom "half" of the wave. In other embodiments, the left slope of the wave has a different angle than the right slope of the wave. Although in some embodiments, the waveform is not an exact sinusoidal shape, or even symmetrical at times, as used herein, the waveform with the rounded corners is described as being a sinusoidal shape or waveform and also as an oscillating pattern.

The "frequency" of this sinusoidal shape is based on the width 110 and the pitch 120 described earlier in FIG. 1. As described earlier, one of a variety of lithography techniques is used to define the width 110 and the pitch 120 of the trenches such as immersion lithography, double patterning, EUV and DSA techniques, and so on. The sinusoidal waveform is used to create an oscillating structure to be used as a MIM capacitor with relatively high density (capacitance per area).

Figure 5:
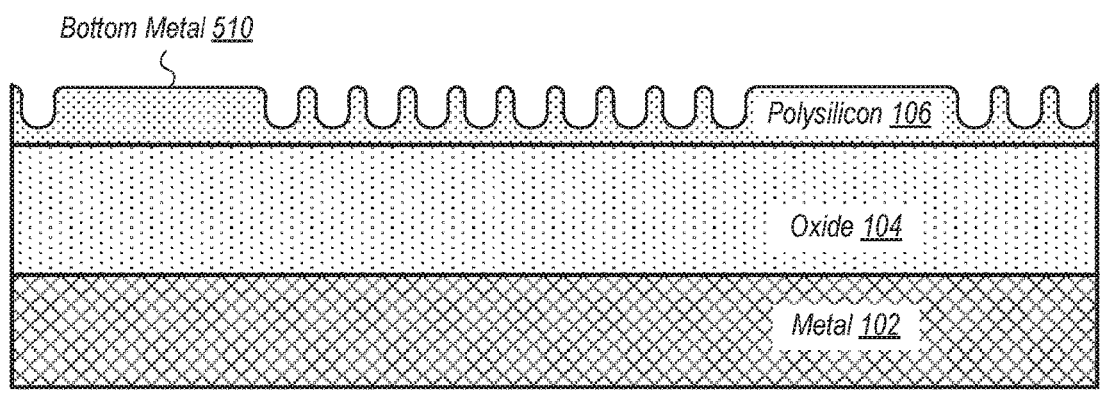
FIG. 5 is a generalized diagram of another cross-sectional view of a portion of a semiconductor passive component being fabricated.
Figure 6:
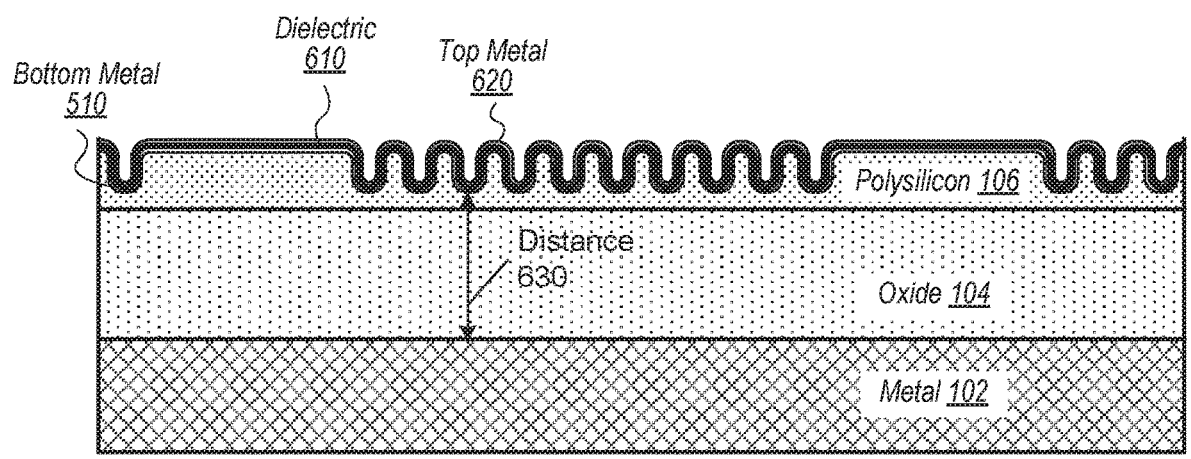
FIG. 6 is a generalized diagram of another cross-sectional view of a portion of a semiconductor passive component being fabricated.

Turning now to FIGS. 5-6, block diagrams of cross-sectional views of a portion of a semiconductor passive component being fabricated are shown. In particular, the metal-insulator-metal layers are deposited for the MIM capacitor. As shown in FIG. 5, the bottom metal is formed for the MIM capacitor. In some embodiments, the bottom metal 510 is tantalum nitride (TaN), whereas in other embodiments, the bottom metal 510 is titanium nitride (TiN). In various embodiments, the bottom metal 510 is placed by atomic layer deposition (ALD). In other embodiments, physical vapor deposition (PVD) such as a sputter technique, is used.

Following, as shown in FIG. 6, a relatively high-K oxide dielectric 610 is formed on the bottom metal 510. Examples of the oxide 610 are hafnium oxide (HfO2) and other rare earth metal oxides. In various embodiments, an atomic layer deposition (ALD) is used to place the dielectric 610. The top metal 620 is deposited on the dielectric 610 using a same metal compound and similar technique to deposit the bottom metal 510. The combination of the bottom metal 510, the dielectric 610 and the top metal 620 provides the metal-insulator-metal (MIM) capacitor. As shown, the sinusoidal structure being used to provide the MIM capacitor is located an appreciable distance 630 from the metal layer 102. In some embodiments, the distance 630 is located approximately midway between the metal layer and a second metal layer deposited later on vias used to create nodes for the MIM capacitor. In such embodiments, the MIM capacitor with the oscillating pattern is not located appreciably closer to the metal layer 102 compared to the second metal layer, and thus, the appreciable distance 630 reduces the coupling capacitance to the metal layer 102 reducing cross talk between the MIM capacitor and the signal wires on the same metal level as metal layer 102. Additionally, the decreased coupling capacitance due to the appreciable distance 630 aids in reducing power consumption and increasing performance.

Figure 7:
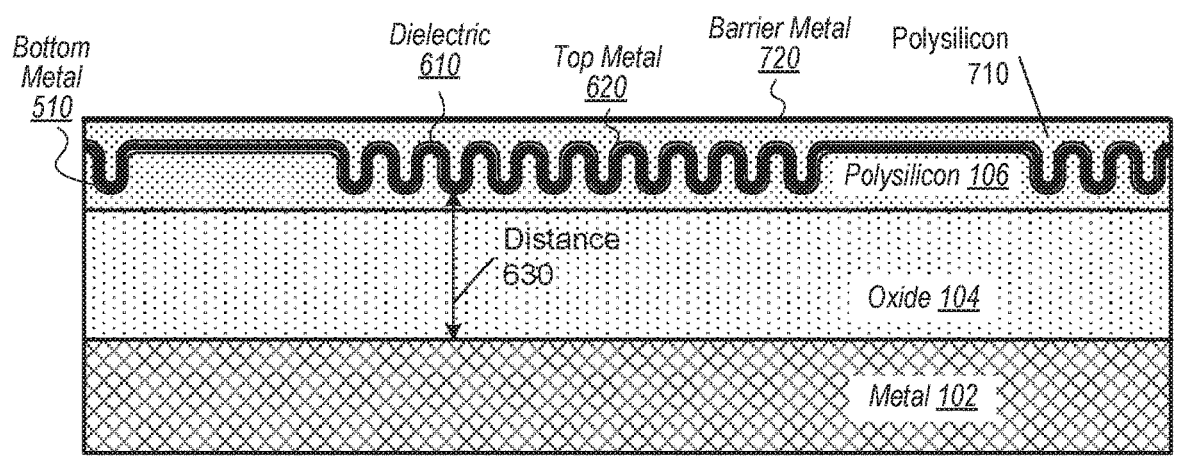
FIG. 7 is a generalized diagram of another cross-sectional view of a portion of a semiconductor passive component being fabricated.
Figure 8:
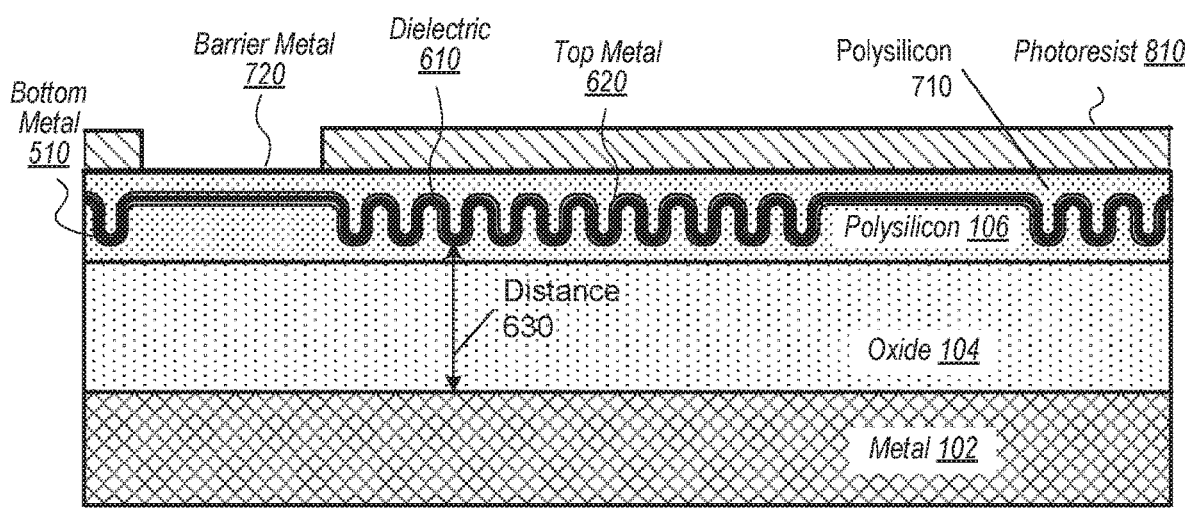
FIG. 8 is a generalized diagram of another cross-sectional view of a portion of a semiconductor passive component being fabricated.

Turning now to FIGS. 7-10, block diagrams of cross-sectional views of a MIM capacitor being fabricated are shown. FIG. 7 shows an additional polysilicon layer 710 is deposited on the top metal layer 620. In various embodiments, the deposition and CMP steps used earlier for the polysilicon layer 106 are used again. Following, a barrier metal layer 720 is deposited on the polysilicon layer 710. In various embodiments, titanium nitride (TiN) is used. FIG. 8 shows a relatively thin, uniform coating of the photoresist layer 810 formed on the barrier metal 720. As described earlier, UV light is transmitted through a photomask which contains the pattern for the placement of the vias. In these regions, the photoresist layer 810 is removed.

Figure 9:
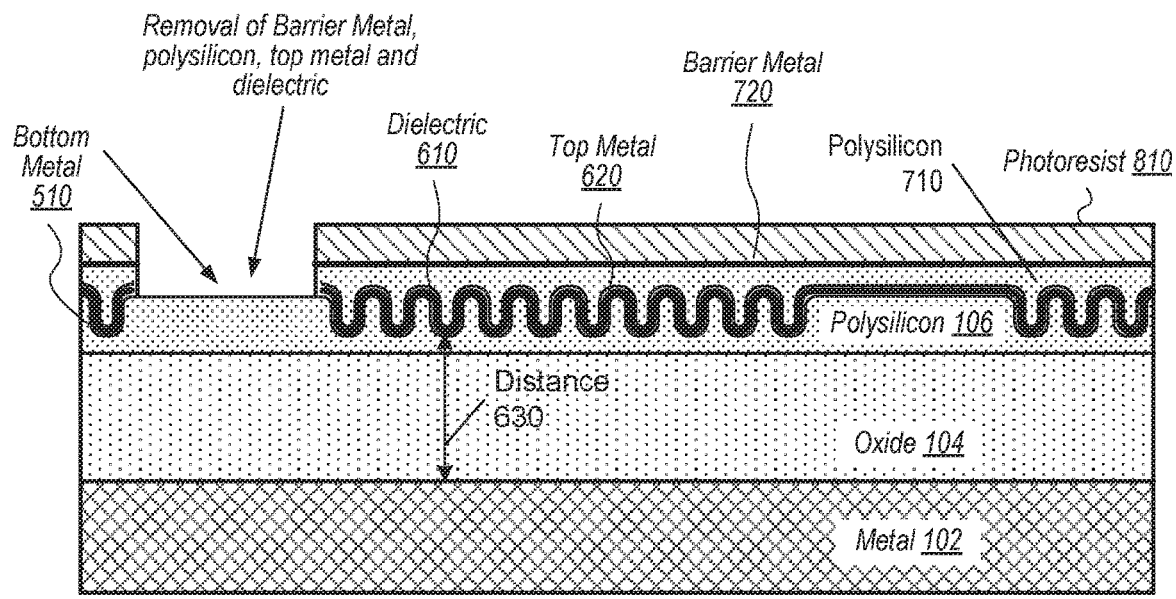
FIG. 9 is a generalized diagram of another cross-sectional view of a portion of a semiconductor passive component being fabricated.
Figure 10:
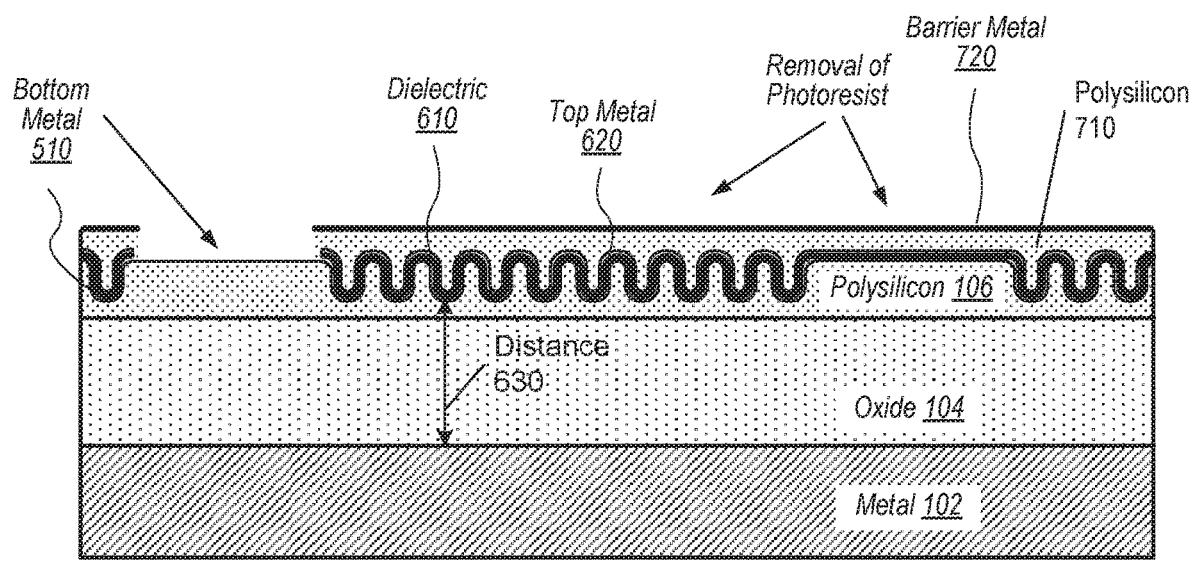
FIG. 10 is a generalized diagram of another cross-sectional view of a portion of a semiconductor passive component being fabricated.

Following, within the region with etched photoresist 810, each of the barrier metal 720, polysilicon 710, top metal 620 and the dielectric 610 are removed as shown in FIG. 9. In FIG. 10, the photoresist layer 810 is removed. Each of the etching steps from the photoresist layer 810 to the dielectric layer 610 in the region is done by one of a variety of methods. For example, in some embodiments, at least one of the methods previously described is used.

Figure 11:
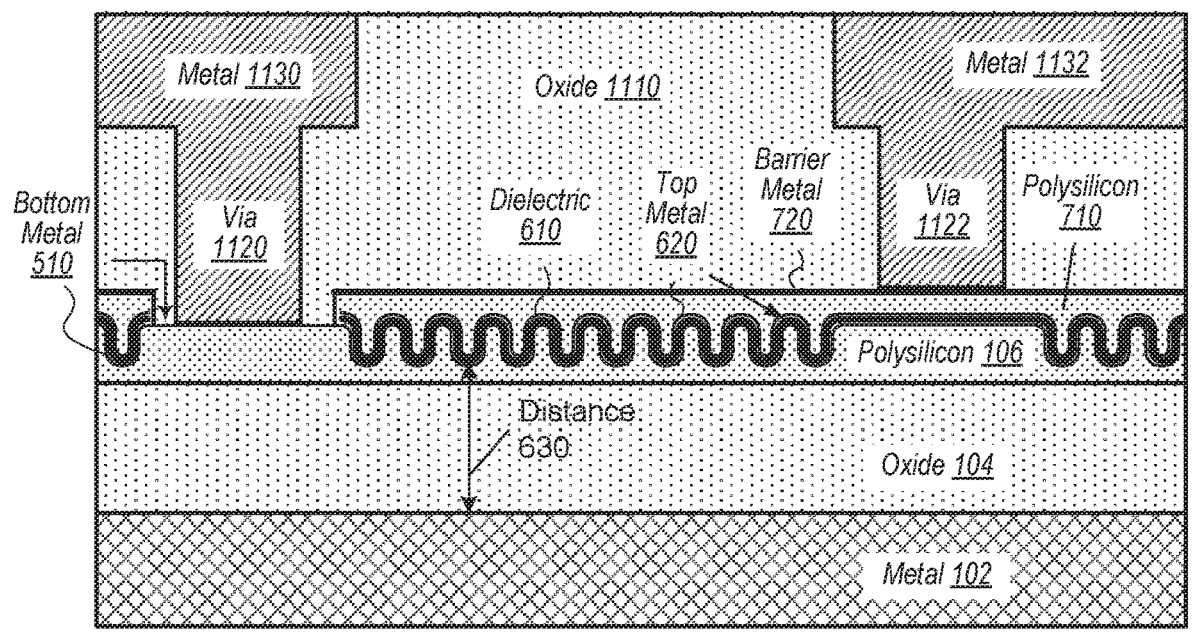
FIG. 11 is a generalized diagram of a cross-sectional view of a fabricated semiconductor metal-insulator-metal (MIM) capacitor with an oscillating pattern.
Figure 12:
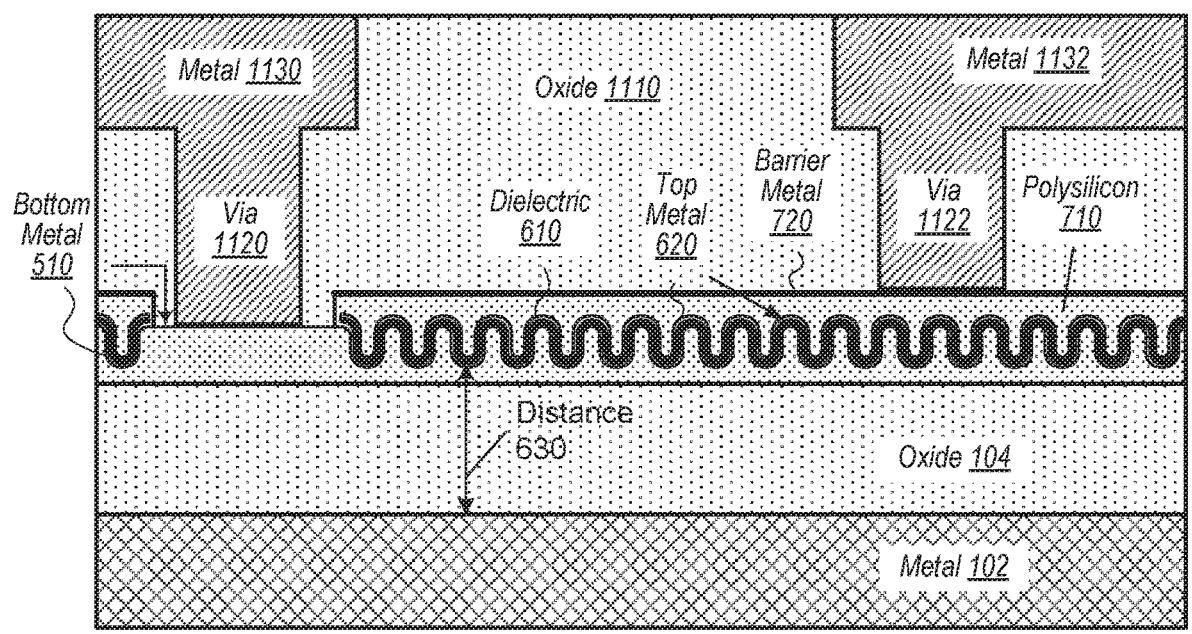
FIG. 12 is a generalized diagram of another cross-sectional view of a fabricated semiconductor metal-insulator-metal (MIM) capacitor with an oscillating pattern.

Referring to FIGS. 11-12, generalized block diagrams of a cross-sectional views of a fabricated semiconductor MIM capacitor with an oscillating pattern are shown. As shown in FIG. 11, the oxide layer 1110 is deposited over the barrier metal layer 720 and the exposed bottom metal 510. Examples of the oxide layer 1110 are TEOS, silicon dioxide, or one of a variety of low-k dielectrics containing carbon or fluorine. In embodiments with aluminum used for metal layers, each of the vias 1120 and 1122 are formed by etching trenches into the oxide layer 1110, filling the trenches with aluminum, and performing a chemical mechanical planarization (CMP) step to polish the surface. Following, each of the metal 1130 and 1132 is formed on the vias 1120 and 1122.

In embodiments with copper used for metal layers, a damascene process is used. Trenches for the metal layers 1130 and 1132 are etched into the oxide layer 1110, photoresist is placed in the trenches, patterns for the vias 1120 and 1122 are etched, the oxide layer 1110 is etched using these patterns to create space for the vias 1120 and 1122, the photoresist is removed and copper is used to fill the created spaces.

As via 1120 makes contact with the bottom metal layer 510 and the via 1122 makes contact with the barrier top metal layer 720, the MIM capacitor is formed with the metal layers 1130 and 1132 providing the voltage nodes. Through the via 1122, the voltage node on metal layer 1132 makes contact with the top metal layer 620 of the MIM capacitor through the each of the conducting barrier metal 720 and the conducting polysilicon layer 710.

As shown in FIG. 12, although the same layers 1110-1132 are formed as described above for FIG. 11, the oscillating pattern of the MIM capacitor continues below via 1122 rather than flattening out. Depending on the width of the via 1122, a significant increase in the capacitance per area (density) of the MIM capacitor is achieved with the continued oscillating pattern.

Figure 13:
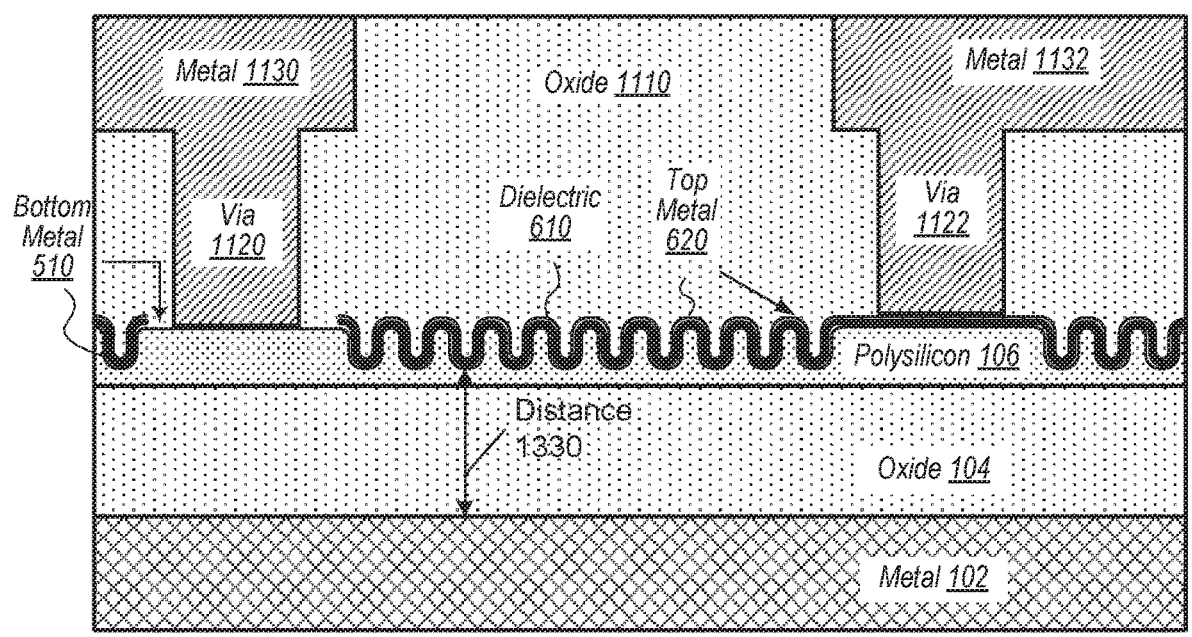
FIG. 13 is a generalized diagram of another cross-sectional view of a fabricated semiconductor metal-insulator-metal (MIM) capacitor with an oscillating pattern.

Referring to FIG. 13, a generalized block diagram of another cross-sectional view of a fabricated semiconductor MIM capacitor with an oscillating pattern is shown. Although the same layers 1110-1132 are formed as described above for FIG. 11, the polysilicon layer 710 and the barrier metal layer 720 are not present. In this embodiment, the layers 710 and 720 were not formed. Rather, photoresist layer is formed on the top metal layer 620, rather than the additional polysilicon layer 710. UV light is transmitted through a photomask which contains the pattern for the placement of the vias. In these regions, the photoresist layer is removed, and each of the top metal 620 and the dielectric 610 are etched in this region followed by the deposition of the oxide layer 1110.

The oxide layer 1110 is etched to create space for the via 1120 which makes contact with the bottom metal layer 510. In this embodiment, the placement of the oscillating structure for the MIM capacitor is closer to the metal layer 102 than when the polysilicon layer 710 is used. Therefore, in various embodiments, the distance 1330 is smaller than the distance 630 shown in previous cross-sectional views. The oscillating structure is moved closer to the metal layer 102 to prevent the etching step for the oxide layer 1110 to additionally etch the top metal layer 620. When the polysilicon layer 710 is used as in the previous examples, the etch rate and etch depth of the oxide layer 1110 is relatively easier to control, and therefore, the oscillating structure is capable of being placed farther away from the metal layer 102 and closer to the top surface of the oxide layer 1110.

Figure 14:
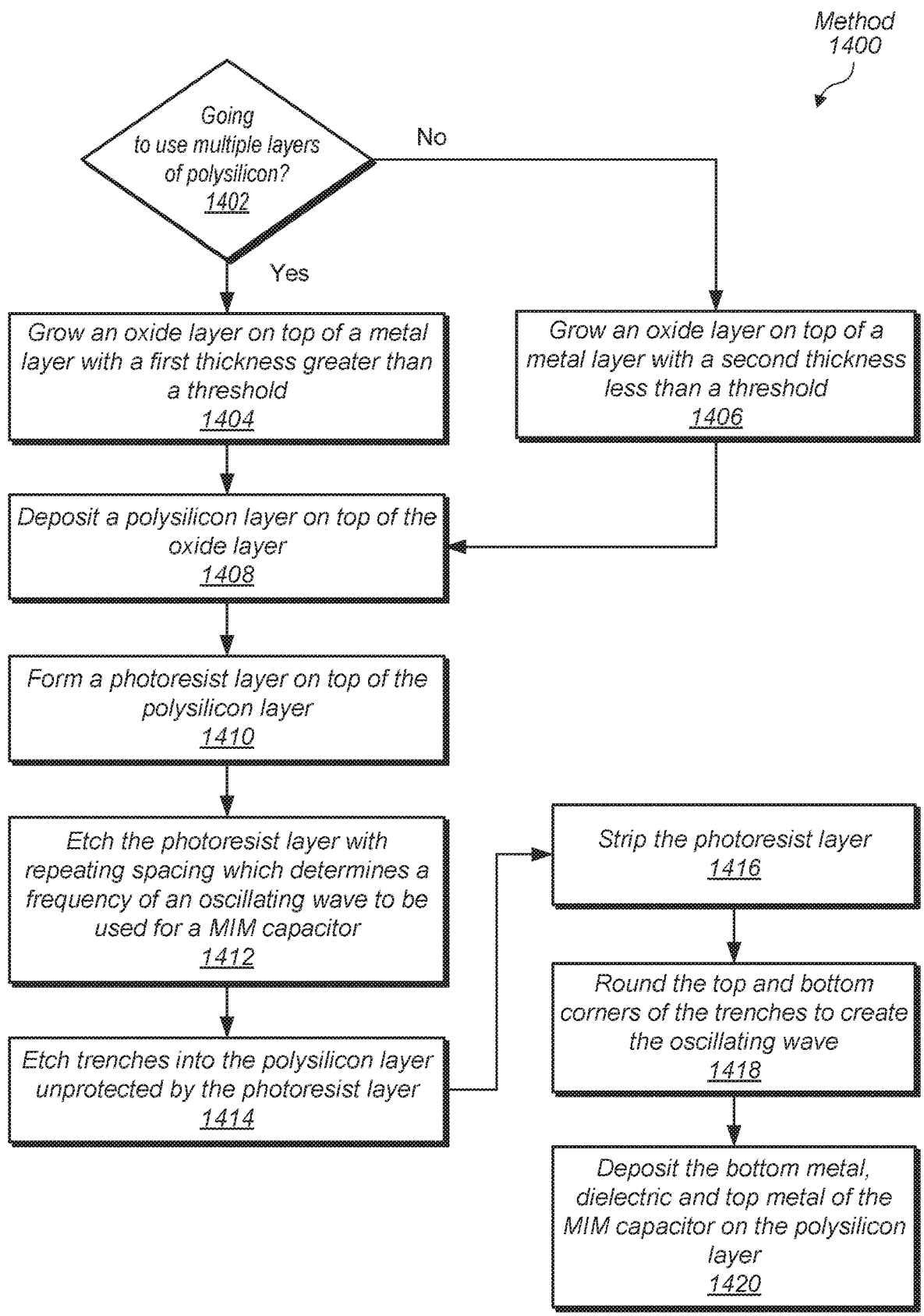
FIG. 14 is a generalized diagram of a method for fabricating a semiconductor metal-insulator-metal (MIM) capacitor with an oscillating pattern.

Turning now to FIG. 14, one embodiment of a method 1400 for fabricating a semiconductor metal-insulator-metal (MIM) capacitor with an oscillating pattern is shown. For purposes of discussion, the steps in this embodiment (as well as in FIG. 15) are shown in sequential order. However, in other embodiments some steps occur in a different order than shown, some steps are performed concurrently, some steps are combined with other steps, and some steps are absent.

If multiple polysilicon layers are going to be used in the process ("yes" leg of the conditional block 1402), then an oxide layer is formed on top of a metal layer with a first thickness greater than a threshold (block 1404). In various embodiments, the oxide layer is silicon dioxide grown on top of copper. In some embodiments, a plasma-enhanced chemical vapor deposition (PECVD) process is used to place the oxide layer on the copper. In other embodiments, the metal layer is a mix of copper and aluminum. In various embodiments, the threshold is selected based on how easy it is to control later etchings of layers on top of a bottom metal layer of the MIM capacitor.

The oxide layer is grown with the first thickness greater than the threshold when a polysilicon layer will be present later for etching performed for forming vias. Despite the aggressive etching used at the later time for creating space for vias, the polysilicon layer is used to prevent etching to include the top metal layer of the MIM capacitor. Referring again to FIG. 6, the oxide is grown with a thickness which allows the distance 630 to be used. The distance 630 is greater than the threshold.

If multiple polysilicon layers are not going to be used in the process ("no" leg of the conditional block 1402), then an oxide layer is grown on top of a metal layer with a second thickness less than the threshold (block 1406). The oxide layer is grown with the second thickness less than the threshold when a polysilicon layer will not be present later for etching performed for forming vias. During the aggressive etching used at the later time for creating space for vias, there is no polysilicon layer present to prevent etching to include the bottom metal layer of the MIM capacitor. Referring again to FIG. 13, the oxide is grown with a thickness which allows the distance 1330 to be used where the distance 1330 is less than the previous distance 630. The distance 1330 is additionally less than the threshold.

A polysilicon layer is deposited on top of the oxide layer (block 1408). Afterward, a photoresist layer is formed on top of the polysilicon layer (block 1410). The photoresist layer is etched (block 1412). The etching occurs with repeating spacing which determines a frequency of an oscillating wave to be formed later and used in a MIM capacitor. One of a variety of lithography techniques is used to reduce the pitch (increase the frequency) of the trenches. For example, one of immersion lithography, double patterning, EUV and DSA techniques, and other techniques, is used for creating the spacing in the photoresist layer.

Trenches are etched into areas of the polysilicon layer unprotected by the photoresist layer (block 1414). Following, the photoresist layer is stripped (block 1416). The top and bottom corners of the trenches are rounded to create a basis for the oscillating wave (block 1418). In some embodiments, one or more cycles of relatively high temperature oxidation of the polysilicon layer and oxidation removal are performed to round the corners. Additionally, in some embodiments, atomic-layer etch (ALE) technology is used. In yet other embodiments, the rounded corners of the trenches are already created or partially created by adjusting the parameters used for the earlier plasma etching process on the polysilicon layer. A combination of the techniques are used in still other embodiments. The bottom metal, dielectric and top metal of the MIM capacitor are deposited on the polysilicon layer both on areas with the rounded-corner trenches and on areas without the trenches (block 1420).

Figure 15:
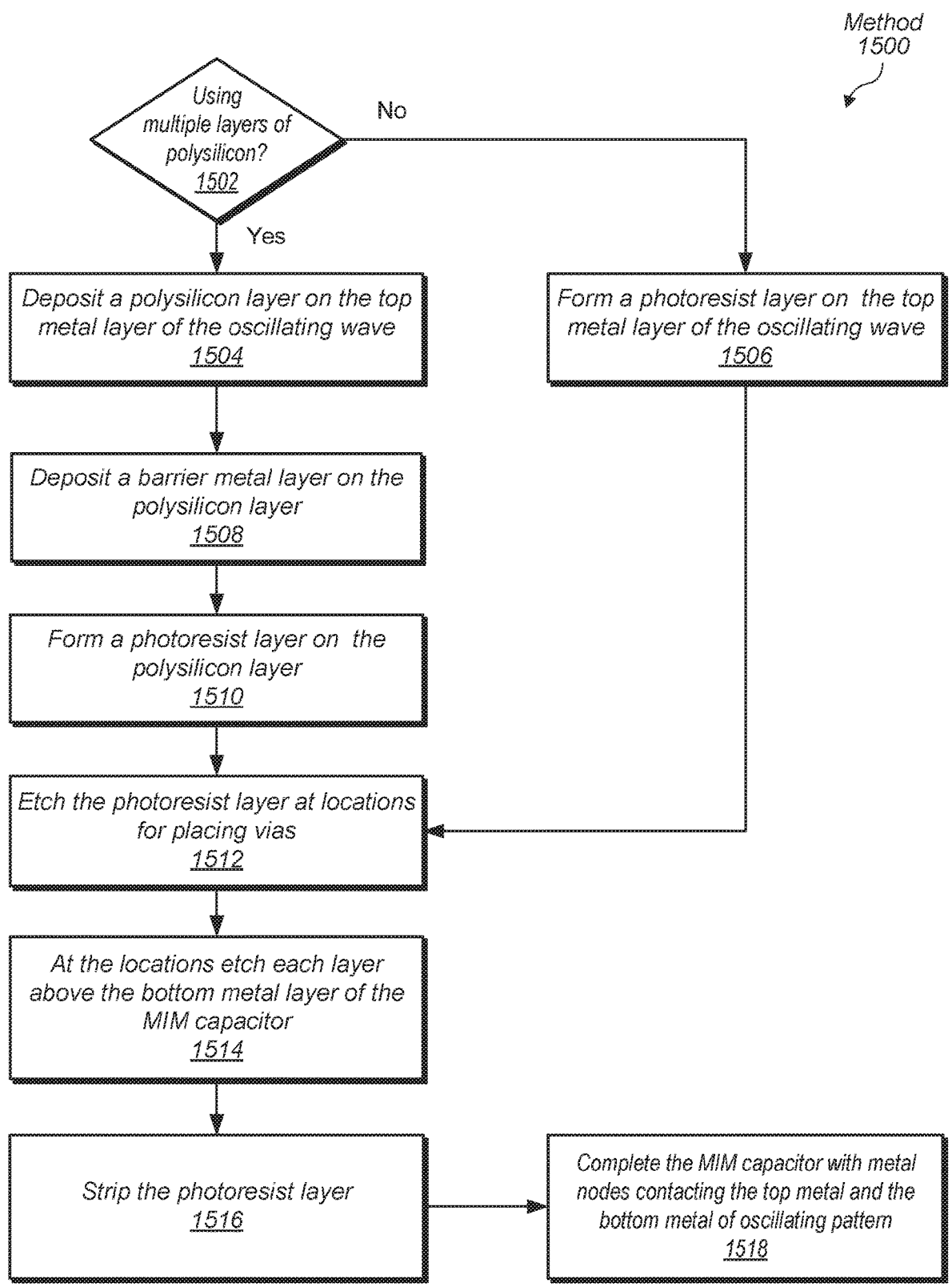
FIG. 15 is a generalized diagram of a method for fabricating a semiconductor metal-insulator-metal (MIM) capacitor with an oscillating pattern.

Referring to FIG. 15, one embodiment of a method 1500 for fabricating a semiconductor metal-insulator-metal (MIM) capacitor with an oscillating pattern is shown. If multiple polysilicon layers are being used in the process ("yes" leg of the conditional block 1502), then a polysilicon layer is deposited on the top metal layer of the oscillating wave (block 1504). Otherwise, a photoresist layer is formed on the top metal layer of the oscillating wave (block 1506). Control flow of method 1500 then moves from 1506 to block 1512, which is described shortly. The control flow moves from block 1504 to block 1508 where a barrier metal layer is deposited on the polysilicon layer.

A photoresist layer is formed on the polysilicon layer (block 1510). Following, the photoresist layer is etched at locations for placing vias (block 1512). At the locations, each layer above the bottom metal layer of the MIM capacitor is etched (block 1514). When multiple polysilicon layers are being used, the layers being etched at the locations for vias are the barrier metal layer, the polysilicon layer, the top metal of the MIM capacitor and the dielectric of the MIM capacitor. When multiple polysilicon layers are not being used, the layers being etched at the locations for vias are the top metal of the MIM capacitor and the dielectric of the MIM capacitor.

Afterward, the photoresist layer is stripped (block 1516). The MIM capacitor is completed with metal nodes contacting each of the top metal and the bottom metal of the oscillating pattern (block 1518). An insulating oxide is deposited either over the barrier metal when multiple polysilicon layers are used or over the oscillating pattern when a single polysilicon layer is used. Trenches are etched into the insulating oxide for vias to be placed. One via makes contact with the bottom metal of the oscillating pattern and a second via makes contact with the top metal of the oscillating pattern through the barrier metal and the polysilicon layer above the top metal.

It is noted that one or more of the above-described embodiments include software. In such embodiments, the program instructions that implement the methods and/or mechanisms are conveyed or stored on a computer readable medium. Numerous types of media which are configured to store program instructions are available and include hard disks, floppy disks, CD-ROM, DVD, flash memory, Programmable ROMs (PROM), random access memory (RAM), and various other forms of volatile or non-volatile storage. Generally speaking, a computer accessible storage medium includes any storage media accessible by a computer during use to provide instructions and/or data to the computer. For example, a computer accessible storage medium includes storage media such as magnetic or optical media, e.g., disk (fixed or removable), tape, CD-ROM, or DVD-ROM, CD-R, CD-RW, DVD-R, DVD-RW, or Blu-Ray. Storage media further includes volatile or non-volatile memory media such as RAM (e.g. synchronous dynamic RAM (SDRAM), double data rate (DDR, DDR2, DDR3, etc.) SDRAM, low-power DDR (LPDDR2, etc.) SDRAM, Rambus DRAM (RDRAM), static RAM (SRAM), etc.), ROM, Flash memory, non-volatile memory (e.g. Flash memory) accessible via a peripheral interface such as the Universal Serial Bus (USB) interface, etc. Storage media includes microelectromechanical systems (MEMS), as well as storage media accessible via a communication medium such as a network and/or a wireless link.

Additionally, in various embodiments, program instructions include behavioral-level descriptions or register-transfer level (RTL) descriptions of the hardware functionality in a high level programming language such as C, or a design language (HDL) such as Verilog, VHDL, or database format such as GDS II stream format (GDSII). In some cases the description is read by a synthesis tool, which synthesizes the description to produce a netlist including a list of gates from a synthesis library. The netlist includes a set of gates, which also represent the functionality of the hardware including the system. The netlist is then placed and routed to produce a data set describing geometric shapes to be applied to masks. The masks are then used in various semiconductor fabrication steps to produce a semiconductor circuit or circuits corresponding to the system. Alternatively, the instructions on the computer accessible storage medium are the netlist (with or without the synthesis library) or the data set, as desired. Additionally, the instructions are utilized for purposes of emulation by a hardware based type emulator from such vendors as Cadence®, EVE®, and Mentor Graphics®.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A semiconductor device fabrication process comprising:
    forming a first oxide layer on top of a signal metal layer used for signal interconnects, wherein:
        the first oxide layer has a first thickness if a polysilicon layer is used below but not above a metal-insulator-metal (MIM) capacitor; and
        the first thickness is based on locating the MIM capacitor closer to the signal metal layer than a given metal layer deposited later to create nodes for the MIM capacitor;
    depositing a polysilicon layer on top of the first oxide layer;
    forming a photoresist layer on top of the polysilicon layer;
    etching the photoresist layer at a plurality of approximately equally spaced locations;
    etching trenches into the polysilicon layer unprotected by the photoresist layer, wherein the trenches occur at the plurality of approximately equally spaced locations;
    stripping the photoresist layer;
    depositing a series of layers on the polysilicon layer to form a metal-insulator-metal capacitor with an oscillating pattern, the series of layers comprising a bottom metal layer, a dielectric layer, and a top metal layer.

2. The semiconductor device fabrication process as recited in claim 1, wherein the process further comprises forming the first oxide layer on top of the signal metal layer, wherein:
    the first oxide layer has a second thickness if a polysilicon layer is used both below and above the MIM capacitor; and
    the second thickness is based on locating the MIM capacitor closer to the given metal layer than the signal metal layer.

3. The semiconductor device fabrication process as recited in claim 2, wherein the process further comprises depositing an additional polysilicon layer, a barrier metal layer and a second oxide layer with a third thickness on the top metal layer if a polysilicon layer is used both below and above a metal-insulator-metal capacitor, wherein the third thickness is based on locating the MIM capacitor closer to the top of the second oxide layer than the signal metal layer.

4. The semiconductor device fabrication process as recited in claim 3, wherein the process further comprises depositing the second oxide layer with a fourth thickness on the top metal layer with no additional polysilicon layer and no barrier metal layer if a polysilicon layer is used below but not above the metal-insulator-metal capacitor, wherein the fourth thickness is based on locating the MIM capacitor closer to the signal metal layer than the top of the second oxide layer.

5. The semiconductor device fabrication process as recited in claim 4, wherein the process further comprises etching each layer above the bottom metal layer in a first location where there is no oscillating pattern, wherein the first location is to be used for a first via making contact with the bottom metal layer.

6. The semiconductor device fabrication process as recited in claim 4, wherein the process further comprises:
    placing a second via at a second location where there is an oscillating pattern if a polysilicon layer is used both below and above a metal-insulator-metal capacitor, wherein the second via makes contact with the top metal layer through the barrier metal layer and the additional polysilicon layer; and
    placing the second via at a third location where there is no oscillating pattern if a polysilicon layer is used below but not above the metal-insulator-metal capacitor, wherein the second via makes contact with the top metal layer through no intermediate layers.

7. The semiconductor device fabrication process as recited in claim 1, wherein the process further comprises rounding top and bottom corners of the trenches prior to depositing the series of layers, wherein the rounding comprises performing one or more cycles of relatively high temperature oxidation of the polysilicon layer and oxidation removal.

8. The semiconductor device fabrication process as recited in claim 6, wherein the process further comprises:
    growing an additional oxide layer on the oscillating pattern; and
    etching trenches for vias in the additional oxide layer.

9. A semiconductor device comprising:
    a signal metal layer used for signal interconnects;
    a first oxide layer on top of a signal metal layer used for signal interconnects, wherein:
        the first oxide layer has a first thickness if a polysilicon layer is used below but not above a metal-insulator-metal (MIM) capacitor; and
        the first thickness is based on locating the MIM capacitor closer to the signal metal layer than a given metal layer deposited later to create nodes for the MIM capacitor;
    a polysilicon layer on top of the first oxide layer; and
    a series of layers on the polysilicon layer, the series of layers comprising a bottom metal layer, a dielectric layer, and a top metal layer, wherein the polysilicon layer comprises areas with trenches to form a metal-insulator-metal capacitor with an oscillating pattern repeating at a given frequency equal to a frequency of an occurrence of the trenches in the polysilicon layer.

10. The semiconductor device as recited in claim 9, further comprising the first oxide layer on top of the signal metal layer, wherein:
    the first oxide layer has a second thickness if a polysilicon layer is used both below and above the MIM capacitor; and
    the second thickness is based on locating the MIM capacitor closer to the given metal layer than the signal metal layer.

11. The semiconductor device as recited in claim 10, further comprising an additional polysilicon layer, a barrier metal layer and a second oxide layer with a third thickness on the top metal layer if a polysilicon layer is used both below and above a metal-insulator-metal capacitor, wherein the third thickness is based on locating the MIM capacitor closer to the top of the second oxide layer than the signal metal layer.

12. The semiconductor device as recited in claim 11, further comprising the second oxide layer with a fourth thickness on the top metal layer with no additional polysilicon layer and no barrier metal layer if a polysilicon layer is used below but not above the metal-insulator-metal capacitor, wherein the fourth thickness is based on locating the MIM capacitor closer to the signal metal layer than the top of the second oxide layer.

13. The semiconductor device as recited in claim 12, further comprising a first via creating contact with the bottom metal layer at a first location where the oscillating pattern is interrupted by a non-oscillating pattern.

14. The semiconductor device as recited in claim 12, further comprising:
- a second via at a second location where there is an oscillating pattern if a polysilicon layer is used both below and above a metal-insulator-metal capacitor creating contact with the top metal layer through the barrier metal layer and the additional polysilicon layer; and
- the second via at a third location where there is no oscillating pattern if a polysilicon layer is used below but not above the metal-insulator-metal capacitor, wherein the second via makes contact with the top metal layer through no intermediate layers.

15. The semiconductor device as recited in claim 9, wherein the signal metal layer is on top of an inter-level dielectric used to insulate metal layers used for interconnects.

16. A non-transitory computer readable storage medium storing program instructions, wherein the program instructions for performing a semiconductor fabrication process are executable by a processor to:
- form a first oxide layer on top of a signal metal layer used for signal interconnects, wherein:
  - the first oxide layer has a first thickness if a polysilicon layer is used below but not above a metal-insulator-metal (MIM) capacitor; and
  - the first thickness is based on locating the MIM capacitor closer to the signal metal layer than a given metal layer deposited later to create nodes for the MIM capacitor;
- deposit a polysilicon layer on top of the first oxide layer;
- form a photoresist layer on top of the polysilicon layer;
- etch the photoresist layer at a plurality of approximately equally spaced locations;
- etch trenches into the polysilicon layer unprotected by the photoresist layer, wherein the trenches occur at the plurality of approximately equally spaced locations;
- strip the photoresist layer;
- deposit a series of layers on the polysilicon layer, the series of layers comprising a bottom metal layer, a dielectric layer, and a top metal layer to form a metal-insulator-metal capacitor with an oscillating pattern.

17. The non-transitory computer readable storage medium as recited in claim 16, wherein the program instructions are further executable by a processor to form the first oxide layer on top of the signal metal layer, wherein:
- the first oxide layer has a second thickness if a polysilicon layer is used both below and above the MIM capacitor; and
- the second thickness is based on locating the MIM capacitor closer to the given metal layer than the signal metal layer.

18. The non-transitory computer readable storage medium as recited in claim 17, wherein the program instructions are further executable by a processor to deposit an additional polysilicon layer, a barrier metal layer and a second oxide layer with a third thickness on the top metal layer if a polysilicon layer is used both below and above a metal-insulator-metal capacitor, wherein the third thickness is based on locating the MIM capacitor closer to the top of the second oxide layer than the signal metal layer.

19. The non-transitory computer readable storage medium as recited in claim 18, wherein the program instructions are further executable by a processor to deposit the second oxide layer with a fourth thickness on the top metal layer with no additional polysilicon layer and no barrier metal layer if a polysilicon layer is used below but not above the metal-insulator-metal capacitor, wherein the fourth thickness is based on locating the MIM capacitor closer to the signal metal layer than the top of the second oxide layer.

20. The non-transitory computer readable storage medium as recited in claim 19, wherein the program instructions are further executable by a processor to:
- etch each layer above the bottom metal layer in a first location where there is no oscillating pattern, wherein the first location is to be used for a first via making contact with the bottom metal layer;
- place a second via at a second location where there is an oscillating pattern if a polysilicon layer is used both below and above a metal-insulator-metal capacitor, wherein the second via makes contact with the top metal layer through the barrier metal layer and the additional polysilicon layer; and
- place the second via at a third location where there is no oscillating pattern if a polysilicon layer is used below but not above the metal-insulator-metal capacitor, wherein the second via makes contact with the top metal layer through no intermediate layers.

* * * * *